United States Patent
Bohon, III

(10) Patent No.: US 6,565,669 B1
(45) Date of Patent: May 20, 2003

(54) VIBRATING WAFER PARTICLE CLEANER

(75) Inventor: Ellis Gray Bohon, III, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 09/702,352

(22) Filed: Oct. 31, 2000

(51) Int. Cl.⁷ .................................................. B08B 5/04
(52) U.S. Cl. ............................ 134/21; 134/10; 134/37; 134/167 R; 134/1.3; 134/22.18; 134/1; 34/14; 34/17; 34/60; 156/5.37; 156/34
(58) Field of Search ................................. 34/14, 17, 60, 34/164, 401, 58; 134/37, 10, 167 R, 1.3, 21, 1, 22.18, 57 R, 7, 140, 153; 156/34, 5.37; 700/11, 2

(56) References Cited

U.S. PATENT DOCUMENTS 5,105,557 A  *  4/1992  Vadasz et al. ................. 34/401
5,238,503 A  *  8/1993  Phenix et al. .................. 134/37

FOREIGN PATENT DOCUMENTS

JP          09064000       *  9/1997

* cited by examiner

Primary Examiner—Randy Gulakowski
Assistant Examiner—Gentle Winter
(74) Attorney, Agent, or Firm—Schwegman, Lundberg, Woessner & Kluth, P.A.

(57) ABSTRACT

A vibrating wafer particle cleaner for cleaning a semiconductor wafer. The cleaner removes particles from the surfaces of the wafer by vibrating the wafer inside an enclosure and passing a filtered air stream at the wafer to flush the particles out of the enclosure.

15 Claims, 3 Drawing Sheets

VIBRATING WAFER PARTICLE CLEANER

TECHNICAL FIELD OF THE INVENTION

The present invention relates generally to cleaning machines and in particular to a semiconductor wafer cleaner.

BACKGROUND OF THE INVENTION

A semiconductor wafer is a foundation for many integrated circuits or electronic devices. During manufacturing, the wafer needs to be cleaned to remove contaminant particles on the surfaces of the wafer. The contaminant particles can be caused by people, machines, process chemicals, or particle-shedding materials in the wafer environment. Cleaning the wafer improves the quality of the devices formed on it. Cleaning the wafer also reduces the chance of defective devices.

Different kinds of machines for cleaning a wafer are commercially available. These machines use either one or a combination of two known wet cleaning methods. In one method, the wafer is submerged in a cleaning solution. The cleaning solution dissolves or breaks the particles off the surfaces of the wafer. In another method, the wafer is cleaned by a mechanical contact means, such as a soft brush or a sponge, with the assist of some types of chemical solution. The brush or sponge wipes particles off the surfaces of the wafer.

There is a need for another kind of cleaner for cleaning semiconductor wafers without using cleaning solution or mechanical contact.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
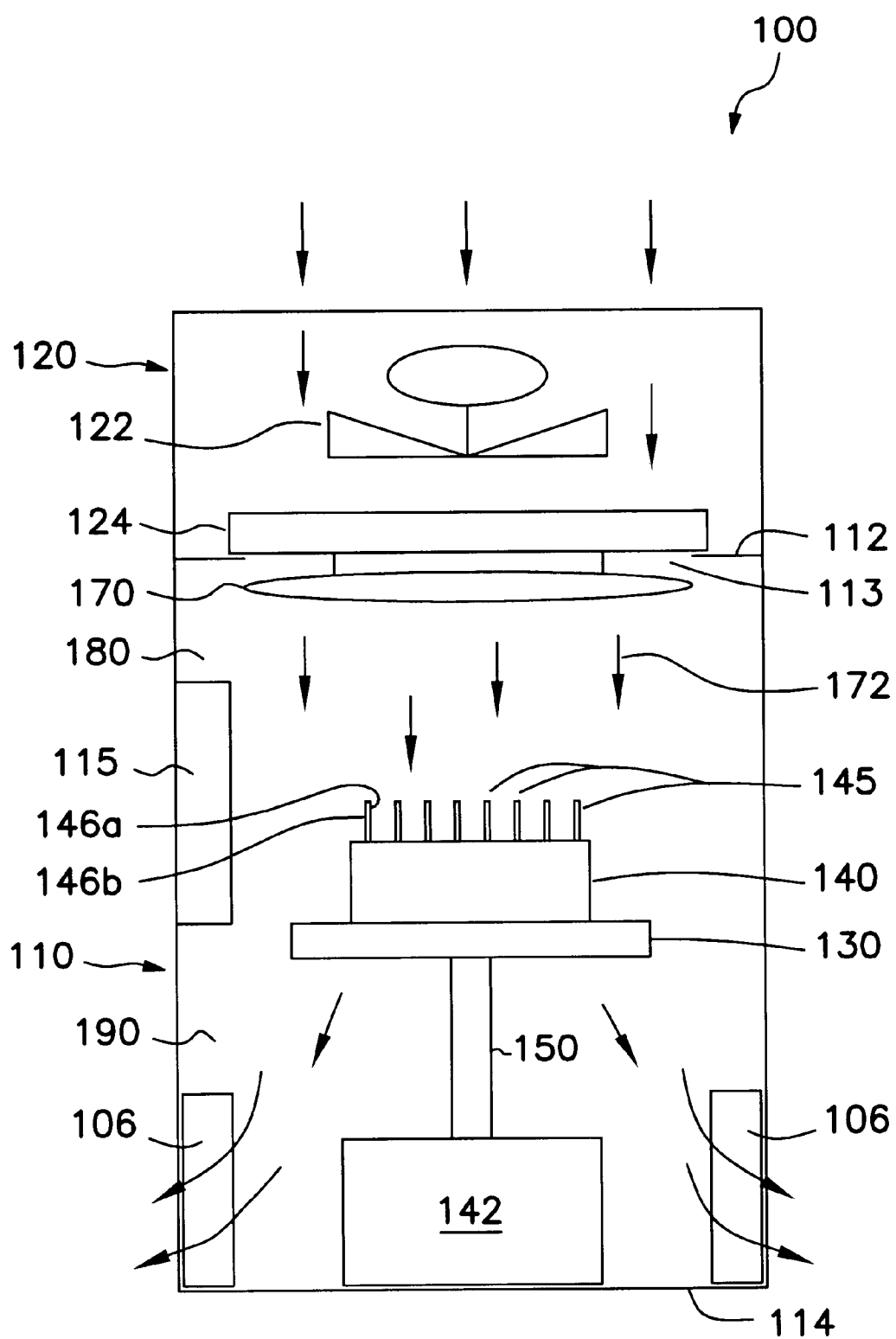
FIG. 1 is a wafer particle cleaner according to the invention.

FIG. 1 is a wafer particle cleaner 100 according to the invention. Cleaner 100 includes an enclosure 110 having a top surface 112. Top surface 112 has an opening 113 so that outside air can be drawn into enclosure 110 through opening 113. Enclosure 110 also has a bottom 114 and at least one air outlet 106 located near bottom 114. An access 115 is located on a side wall of enclosure 110. An air intake unit 120 is attached to enclosure 110. A wafer mount unit 130 is provided to receive a wafer holder 140, which holds one or more semiconductor wafers 145. A vibration generator 142 mechanically connects to wafer mount unit 130 by a linkage 150. In addition cleaner 100 also includes an optional ionizer unit 170, which is located between air intake unit 120 and wafer mount unit 130.

Enclosure 110 isolates its inside from dirt or other contamination sources from outside. Outlet 106 of enclosure 110 can be a plurality of openings or slots arranged side by side or in other orientations. In general, outlet 106 serves as escape passage for air and particles to flush out of enclosure 110. Access 115 can be sliding door or hinged door which can be manually opened or closed. Wafer holder 140 or wafers 145 can be transported in and out of enclosure 110 through access 115. In addition, access 115 also be programmed to automatically open or close at certain time during a cleaning process.

Air intake unit 120 includes a fan or a blower 122 and a filter 124. Blower 122 is orientated in a way such that when operated, it draws outside air and forces the air through filter 124 and opening 113 into enclosure 110. Filter 124 is an ultra low penetration air (ULPA) filter, or a high efficiency particle air (HEPA) filter or any other type of filter suitable to trap microscopic airborne particles. In FIG. 1, air intake unit 120 is mounted on top surface 112 of enclosure 110; however, air intake unit 120 can be attached to the side of enclosure 110. In general, the location of air intake unit 120 can be anywhere.

Wafer mount unit 130 is configurable or adaptable to receive different kinds of wafer holders. In one embodiment, wafer holder 140 holds a single wafer. In another embodiment, wafer holder 140 holds more than one or multiple wafers. In either embodiment, wafer 145 is placed vertically in wafer holder 140, or parallel to an air stream generated by air intake unit 120. In other words, wafer 145 is placed in a way so that particles shaken off both flat surfaces of wafer 145 can easily be captured and carried away by the air stream running along the flat surfaces. In FIG. 1, flat surfaces of wafer 145 are indicated as 146a and 146b. Surfaces 146a and 146b are parallel to each other. In the embodiment shown in FIG. 1, surfaces 146a and 146b are positioned vertically in wafer holder 140.

Vibration generator 142 can be any type of commercially available generator, which is capable of generating a continuous vibration. In one embodiment, vibration generator 142 is a permanent magnet type of vibration generator, which is capable of producing a sinusoidal vibration in the range of 5 to 13,000 Hertz. In another embodiment, vibration generator 142 is an electrodynamic type of vibration generator, which produces similar output as the permanent magnet type of vibration generator. In general, vibration generator 142 can be any type of vibration generator, which can produce a continuous vibration to shake particles off surfaces 146a–b of wafer 145. Linkage 150 connected between wafer mount unit 130 and vibration generator 142 transfers the continuous vibration generated by vibration generator 142 to wafer mount unit 130. In FIG. 1 vibration generator 142 is located inside enclosure 110. Vibration generator 142, however, can also be located outside enclosure 110. In general the location of vibration generator 142 is arbitrary.

In operation, wafer mount unit 130 is vibrated by vibration generator 142. The vibration causes debris or particles adhered surfaces 146a–b of wafer 145 to shake free from surfaces 146a–b. The freed particles are carried away or flushed out of enclosure 110 by a filtered air stream.

The air stream is generated by air intake unit 120, which uses blower 122 to draw an outside air and forces the air through filter 124 and opening 113 into enclosure 110. The air stream follows a direction, indicated by arrow 172, from an upstream location to a downstream location. An upstream location refers to any location in which the air stream flows by before reaching wafer mount unit 130 such as location 180; and a downstream location refers to any location in which the air stream flows by after reaching wafer mount unit 130, such as location 190. Before the air stream enters enclosure 110, it is filtered by filter 124 to remove dirt or airborne particles to produce the filtered air stream. After entering enclosure 110, the filtered air stream is forced downstream to wafer 145. The filtered air stream passes by surfaces 146a–b of wafer 145 and carries with it particles which are shaken off wafer 145 by the vibration. The particles are subsequently flushed by the filtered air stream out of enclosure 110 via outlets 106.

Ionizer unit 170 is an optional unit of cleaner 100. However, ionizer unit 170 can assist the vibration in removing particles from surfaces 146a–b of wafer 145. Ionizer unit 170 can also have its own removal mechanism. For example, electrostatic charges can cause the particles to adhere to surfaces 146a–b of wafer 145. Ionizer unit 170 can either neutralize or remove the electrostatic charges on or near surfaces 146a–b of wafer 145. Ionizer unit 170 can cause the electrostatic charges to repel, forcing the particles to detach from surfaces 146a–b of wafer 145.

Figure 2:
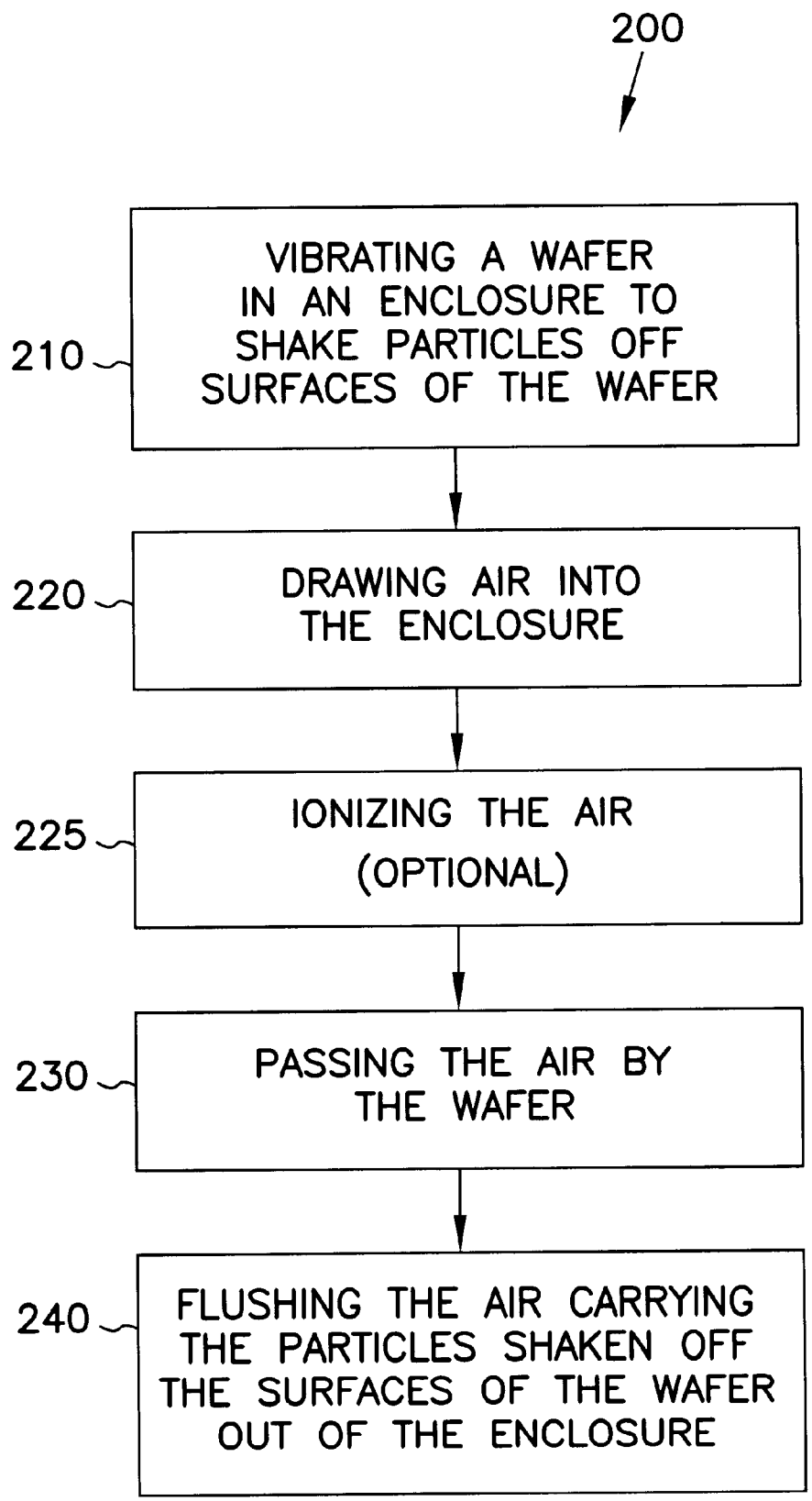
FIG. 2 is a flow chart illustrating a method of cleaning a wafer according to the invention.

FIG. 2 is a flow chart illustrating a method 200 according to the invention. In general, method 200 describes a method of cleaning a semiconductor wafer by vibrating the wafer while passing a filtered air stream by the wafer.

In step 210, a wafer placed inside an enclosure is physically vibrated by a vibration generator. The vibration generator can be located inside or outside the enclosure. The vibration is transferred to the wafer by a link connected between the vibration generator and a wafer mount unit where the wafer is situated. Particles clinging to the surfaces of the wafer are shaken off the surfaces by the vibration.

In step 220, an air stream from the outside is drawn into the enclosure by an air intake unit mounted on top of the enclosure. The air stream is filtered by a filter of the air intake unit before it enters the enclosure.

In step 225, the filtered air stream is ionized by an ionizer located inside the enclosure. Step 225 is optional, however, the ionization can assist the vibration to remove the particles off the surfaces of the wafer. The ionizer can also neutralize or repel electrostatic charges inside the enclosure, causing the particles to fall off the surfaces easier.

In step 230, the filtered air stream is passed by the wafer to carry away the particles shaken off from the surfaces of the wafer.

In step 240, the filtered air stream with the particles are flushing out of the enclosure through an opening or a slot located near the bottom of the enclosure.

Figure 3:
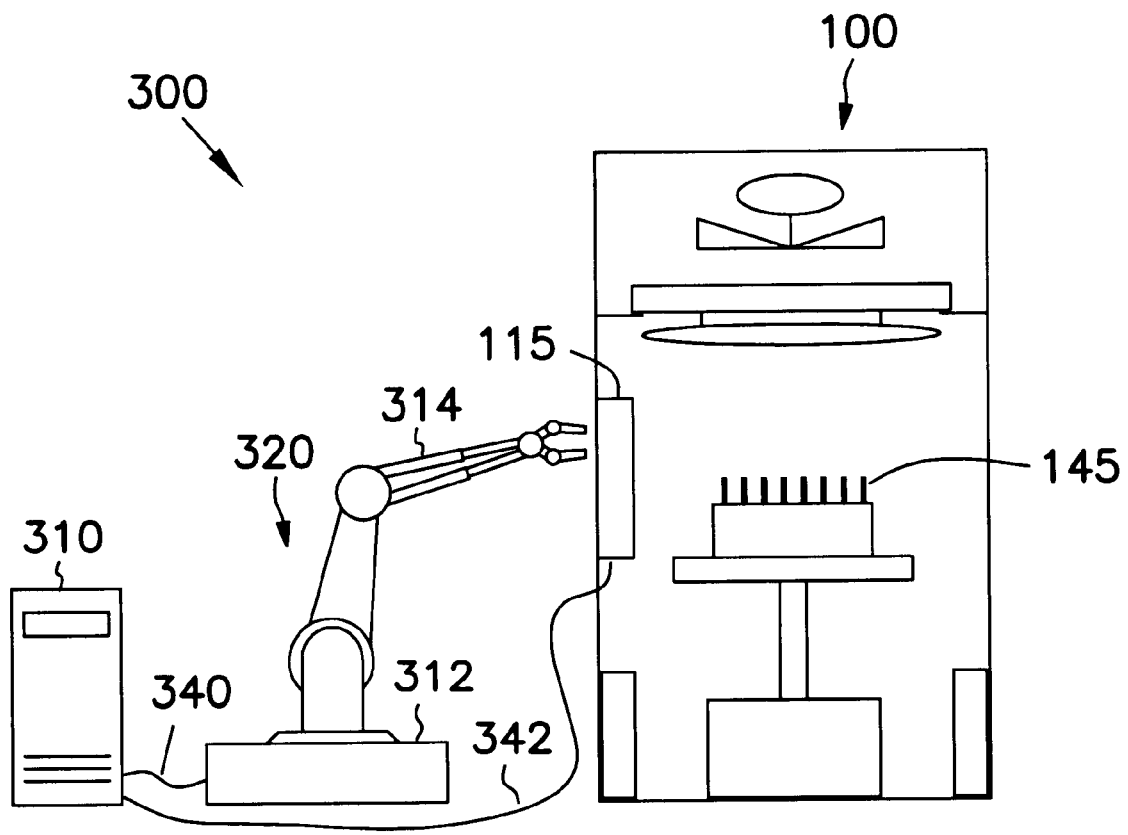
FIG. 3 is a cleaning system according to of the invention.

FIG. 3 is a cleaning system 300 according to the invention. Cleaning system 300 includes a controller 310 connected a transport assembly 320, which transports wafers to and from a wafer particle cleaner 100. Wafer particle cleaner 100 is described in FIG. 1. In cleaning system 300 of FIG. 3, access 115 of cleaner 100 is controlled by controller 310, which to automatically opens or closes access 115 at a predetermined time during a cleaning process. Transport assembly 320 includes a base 312 connected to a mechanical arm 314. During the cleaning process, controller gives instruction commands to transport assembly 320 via communication connection 340, and access 115 via communication connection 342. At a predetermined time, controller 310 instructs access 115 to open such that arm 314 can transport wafer 145 to and from cleaner 330 through access 115.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of cleaning a wafer, the method comprising:
   vibrating the wafer inside an enclosure to shake dry contaminant particles off the wafer, wherein the wafer is dry;
   forcing an unheated air stream through the enclosure;
   passing the unheated air stream by the wafer;
   flushing the unheated air stream out of the enclosure; and
   ionizing the unheated air stream to remove electrostatic charge inside the enclosure.

2. The method of claim 1, wherein forcing an unheated air stream includes filtering the unheated air stream before the unheated air stream is forced through the enclosure.

3. A method of cleaning a wafer, the method comprising:
   vibrating the wafer inside an enclosure, wherein the wafer is dry;
   forcing an unheated air stream through the enclosure;
   passing the unheated air stream by the wafer;
   flushing the unheated air stream out of the enclosure; and
   ionizing the unheated air stream.

4. A method of cleaning a wafer, the method comprising:
   vibrating the wafer inside an enclosure, wherein the wafer is dry;
   passing a filtered air stream by the wafer, wherein the filtered air stream is unheated; and
   ionizing the filtered air stream.

5. The method of claim 4 further includes flushing the filtered air stream out of the enclosure after passing the filtered air stream over the wafer.

6. A method of cleaning a wafer, the method comprising:
   vibrating the wafer inside an enclosure, wherein the wafer is dry;
   passing a filtered air stream by the wafer, wherein the filtered air stream is unheated; and
   ionizing the filtered air stream.

7. A method of cleaning a wafer, the method comprising:
   passing an unheated air stream by one or more semiconductor wafers; and
   vibrating the semiconductor wafers to shake dry contaminant particles off the semiconductor wafers and into the unheated air stream; and
   ionizing the unheated air stream to remove electrostatic charge inside the enclosure.

8. The method of claim 7, wherein passing an unheated air stream includes passing the unheated air stream parallel to flat surfaces of the semiconductor wafers.

9. A method of cleaning a wafer, the method comprising:
   passing an unheated air stream by one or more dry semiconductor wafers;
   vibrating the semiconductor wafers to shake contaminant particles off the dry semiconductor wafers and into the unheated air stream; and
   removing electrostatic charges near surfaces of the dry semiconductor wafers.

10. A method of cleaning a semiconductor wafer, the method comprising:

placing at least one wafer in a wafer holder, wherein the wafer is dry;

mounting the wafer holder on a wafer mount unit located inside an enclosure;

vibrating the wafer mount unit;

forcing an air stream through the enclosure, wherein the air stream is unheated;

filtering the air stream before the air stream is forced through the enclosure to produce a filtered air stream;

ionizing the filtered air stream to remove electrostatic charge inside the enclosure and to produce a filtered and ionized air stream;

passing the filtered and ionized air stream by surfaces of the wafer; and flushing the filtered and ionized air stream out of the enclosure.

11. The method of claim 10, wherein flat surfaces of the wafer are placed vertically in the wafer holder.

12. The method of claim 10, wherein flat surfaces of the wafer are parallel to the filter and ionized air stream.

13. The method of claim 10, wherein forcing an air stream involves forcing the air stream through an opening located on top of the enclosure.

14. The method of claim 10, wherein flushing the filtered and ionized air stream out of the enclosure involves forcing the filtered and ionized air stream downward after the filtered and ionized air stream passes by the surfaces of the wafer.

15. The method of claim 10, wherein flushing the filtered and ionized air stream out of the enclosure involves forcing the filtered and ionized air stream through an opening located near a bottom of the enclosure.

\* \* \* \* \*